(12) United States Patent
Poppe et al.

(10) Patent No.: US 8,845,809 B2
(45) Date of Patent: *Sep. 30, 2014

(54) SCALABLE, HIGH-THROUGHPUT, MULTI-CHAMBER EPITAXIAL REACTOR FOR SILICON DEPOSITION

(75) Inventors: Steve Poppe, Pleasanton, CA (US); Yan Rozenzon, San Carlos, CA (US); David Z. Chen, San Jose, CA (US); Xiaole Yan, Santa Clara, CA (US); Peijun Ding, Saratoga, CA (US); Zheng Xu, Pleasanton, CA (US)

(73) Assignee: Silevo, Inc., Fremont, CA (US)

( * ) Notice: Subject to any disclaimer, the term of this patent is extended or adjusted under 35 U.S.C. 154(b) by 634 days.

This patent is subject to a terminal disclaimer.

(21) Appl. No.: 12/556,454

(22) Filed: Sep. 9, 2009

(65) Prior Publication Data

US 2010/0092698 A1 Apr. 15, 2010

Related U.S. Application Data

(63) Continuation-in-part of application No. 12/355,463, filed on Jan. 16, 2009, now Pat. No. 8,652,259.

(60) Provisional application No. 61/104,166, filed on Oct. 9, 2008.

(51) Int. Cl.

| | | |
|---|---|---|
| *C23C 16/00* | (2006.01) | |
| *C30B 25/16* | (2006.01) | |
| *C23C 16/455* | (2006.01) | |
| *C23C 16/48* | (2006.01) | |
| *C30B 25/12* | (2006.01) | |
| *C30B 25/14* | (2006.01) | |
| *C23C 16/44* | (2006.01) | |
| *C30B 25/10* | (2006.01) | |
| *C23C 16/458* | (2006.01) | |

(52) U.S. Cl.
CPC .......... *C23C 16/4408* (2013.01); *C30B 25/165* (2013.01); *C23C 16/455* (2013.01); *C23C 16/481* (2013.01); *C30B 25/12* (2013.01); *C30B 25/14* (2013.01); *C30B 25/105* (2013.01); *C23C 16/4587* (2013.01)
USPC ......................... 118/728; 118/719; 118/725

(58) Field of Classification Search
USPC ....................... 118/725, 719, 728; 156/345.31
See application file for complete search history.

(56) References Cited

U.S. PATENT DOCUMENTS

| | | | | |
|---|---|---|---|---|
| 5,038,711 A | * | 8/1991 | Dan et al. | 118/715 |
| 5,994,675 A | * | 11/1999 | Bethune et al. | 219/483 |
| 6,262,393 B1 | * | 7/2001 | Imai et al. | 219/390 |
| 6,472,639 B2 | * | 10/2002 | Nishitani et al. | 219/390 |
| 2003/0012885 A1 | * | 1/2003 | Gramarossa et al. | 427/421 |

* cited by examiner

*Primary Examiner* — Karla Moore
*Assistant Examiner* — Nathan K Ford
(74) *Attorney, Agent, or Firm* — Park, Vaughan, Fleming & Dowler LLP; Shun Yao

(57) ABSTRACT

One embodiment provides an apparatus for material deposition. The apparatus includes a reaction chamber, and a pair of susceptors. Each susceptor has a front side mounting substrates and a back side. The front sides of the vertically positioned susceptors face each other, and the vertical edges of the susceptors are in contact with each other. The apparatus also includes a number of gas nozzles for injecting reaction gases. The gas flow directions inside the chamber can be alternated by controlling the gas nozzles. The gas nozzles are configured to inject a small amount of purge gas including at least one of: HCl, SiCl$_4$, and H$_2$ when the gas nozzles are not injecting reaction gas. The apparatus includes a number of heating units situated outside the reaction chamber. The heating units are arranged in such a way that they radiate heat energy directly to the back sides of the susceptors.

7 Claims, 6 Drawing Sheets

SCALABLE, HIGH-THROUGHPUT, MULTI-CHAMBER EPITAXIAL REACTOR FOR SILICON DEPOSITION

RELATED APPLICATION

This application is a continuation-in-part application of application Ser. No. 12/355,463, now U.S. Pat. No. 8,652,259, entitled "Scalable, High Throughput, Multi-chamber Epitaxial Reactor for Silicon Deposition," by inventors Steve Poppe, Yan Rozenzon, David Z. Chen, Xiaole Yan, Peijun Ding, and Zheng Xu, filed 16 Jan. 2009, which claims the benefit of U.S. Provisional Application No. 61/104,166, entitled "Scalable, High Throughput, Multi-chamber CVD Reactor for Silicon Deposition" by inventors Steve Poppe, Yan Rozenzon, David Z. Chen, Xiaole Yan, Peijun Ding, and Zheng Xu, filed 9 Oct. 2008.

BACKGROUND

1. Field

This disclosure is generally related to silicon deposition. More specifically, this disclosure is related to a scalable, high throughput multi-chamber batch type epitaxial reactor for silicon deposition.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer of similar material. A hetero-junction structure includes at least two layers of materials of different bandgaps. A p-i-n/n-i-p structure includes a p-type doped layer, an n-type doped layer, and an optional intrinsic (undoped) semiconductor layer (the i-layer) sandwiched between the p-layer and the n-layer. A multi-junction structure includes multiple semiconductor layers of different bandgaps stacked on top of one another.

In a solar cell, light is absorbed near the p-n junction generating carries. The carries diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

Materials that can be used to construct solar cells include amorphous silicon (a-Si), polycrystalline silicon (poly-Si), crystalline-silicon (crystalline Si), cadmium telluride (CdTe), etc. FIG. 1 illustrates an exemplary crystalline-silicon thin-film solar cell. Solar cell 100 includes a low-grade crystalline-Si substrate 102, a p-type doped single-crystal Si layer 104, an $n^+$ silicon emitter layer 106, front electrodes 108, and an Al back electrode 110. Arrows in FIG. 1 indicate incident sunlight.

Based on industrial surveys, crystalline-Si-wafer based solar cells dominate nearly 90% of the market. However, the cost of producing crystalline-Si-wafer based solar cell is high, and the waste of Si material in the processes of ingot-cutting and wafer-polishing has caused a bottleneck in the supply of crystalline-Si wafers. Due to the soaring price and the supply shortage of Si material, there has been a great interest in alternative ways to make solar cells. Recently, photovoltaic thin-film technology has been drawing vast interest because it can significantly reduce the amount of material used and thus lower the cost of solar cells. Among various competing technologies, single-crystal Si thin-film solar cells have drawn great interest for their low cost and high efficiency.

Single-crystal Si thin-film solar cells can be created using conventional semiconductor epitaxy technologies which not only reduce manufacturing costs but also enable flexible doping levels in the emitter, absorber and back surface field of the solar cell, thus enhancing its efficiency. Single-crystal Si thin-film solar cells with an efficiency as high as 17% have been demonstrated in research labs (see M. Reutuer et al., "17% Efficient 50 μm Thick Solar Cells," *Technical Digest, 17th International Photovoltaic Science and Engineering Conference*, Fukuoka, Japan, p. 424).

A high-quality single-crystal Si thin film can be produced using Si epitaxy, which has been widely used in semiconductor industry to create a high-quality single-crystal Si layer for CMOS integrated circuits, power devices and high voltage discrete devices. Among possible Si epitaxial deposition techniques, trichlorosilane (TCS) based chemical-vapor-deposition (CVD) can provide a deposition rate up to 10 μm/min. Therefore, it is possible to achieve a high-throughput and low-cost epitaxial process for solar cell application.

However, there is a lack of suitable Si epitaxy tools that can meet the demand for high throughput and low deposition cost for Si film layers with thickness up to several tens of microns, as required by the solar cell industry. Existing Si epitaxy tools, such as AMC7810™ and Centura 5200™ by Applied Materials Inc. of Santa Clara, Calif., US; MT7700™ by Moore Epitaxial Inc. of Tracy, Calif., US; PE2061™ by LPE Epitaxial Technology of Italy; and Epsilon 3200™ by ASM International of the Netherlands, are optimized for the needs of semiconductor device manufacturing. Although these epitaxial tools can deliver Si films with the highest quality, these tools are not compatible, in terms of throughput and gas conversion efficiency, with the economics of the solar cell industry.

FIG. 2 presents a diagram illustrating the structure of an existing barrel epitaxial reactor, which is used for the batch process of multiple wafers. Barrel reactor 200 includes a reaction chamber 202, which has a gas inlet 204 at the top and a vent 206 at the bottom. A vertically positioned susceptor 208 holds a number of wafers, such as wafer 210. Radio frequency (RF) heating coils 212 radiate heat onto the susceptor and wafers. Although barrel reactor 200 can batch process multiple wafers, the number of wafers it can process is limited by the architect of the system, the size of the chamber, and the design of the susceptor. Once built, it is difficult to modify the reactor or the susceptor to accommodate more wafers. In addition, the susceptor needs to be rotated during deposition in order to achieve a better uniformity.

U.S. Pat. No. 6,399,510 proposed a reaction chamber that provides a bi-directional process gas flow to increase uniformity without the need for rotating susceptors. However, it does not solve the issues of low throughput, low reaction gas conversion rate, low power utilization efficiency, minimal Si deposition on the quartz chamber, and processing scalability. In addition, using the same gas lines for gas inlet and outlet increased the risk of contamination and re-deposition.

SUMMARY

One embodiment of the present invention provides a system for material deposition. The system includes an AC (alternating current) panel for providing electrical power to the system, a susceptor load/unload station, a running beam coupled to the load/unload station for loading/unloading susceptors, and a multi-chamber module. The multi-chamber module includes a gas box, an SCR panel, and a number of reaction chambers situated next to each other. The reaction chamber is formed using a material that is transparent to radiation energy, a pair of susceptors situated inside the reaction chamber. Each susceptor has a front side and a back side, and the front side mounts a number of substrates. The susceptors are positioned vertically in such a way that the front sides of the susceptors face each other, and the vertical edges of the susceptors are in contact with each other, thereby forming a substantially enclosed narrow channel between the substrates mounted on different susceptors. The system also includes a number of gas nozzles. At least one of the gas nozzles includes a gas inlet for injecting reaction gas into the narrow channel and a gas outlet for outputting exhaust. The gas inlet and the gas outlet are coupled to different gas lines, and the gas inlet and the gas outlet are controlled in such a way that reaction gas flow directions inside the narrow channel can be alternated, thereby facilitating uniform material deposition. The gas inlet is configured to inject a small amount of purge gas when the gas inlet is not injecting reaction gas to the narrow channel during material deposition, thereby preventing material deposition around the gas inlet. The purge gas comprises at least one of the following: HCl, $SiCl_4$, and $H_2$. In addition, the system includes a number of heating units situated outside the reaction chamber. At least one heating unit is situated between the side walls of two adjacent reaction chambers, thereby allowing the at least one heating unit to heat the two adjacent reaction chambers simultaneously. In addition, the heating units are arranged in such a way that they radiate heat energy directly to the back side of the susceptors.

In a variation on the embodiment, the flow rate of the purge gas is less than 5% of the flow rate of the reaction gas.

One embodiment of the present invention provides a system for material deposition. The system includes a number of reaction chambers placed adjacent to each other. The walls of the number of reaction chambers are formed using a material that is transparent to radiation energy. The system also includes a number of heating units situated outside the reaction chamber. At least one heating unit is placed in between two adjacent reaction chambers, thereby allowing the at least one heating unit to radiate heat energy to both of the two adjacent chambers simultaneously.

In a variation on this embodiment, the system includes a closed-loop feedback control for controlling the number and power of heating units.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a scalable, high-throughput multi-chamber epitaxial reactor for Si deposition. The reactor includes a number of extendible, independently controlled multi-chamber modules. The reaction chambers are heated by lamp heating units which are alternately inserted between adjacent chambers. Each reaction chamber encloses a pair of susceptors for supporting substrates. Reaction gases are injected into the chamber from one side to another alternatively to ensure deposition uniformity.

9-Chamber Epitaxial Reactor

Figure 1:
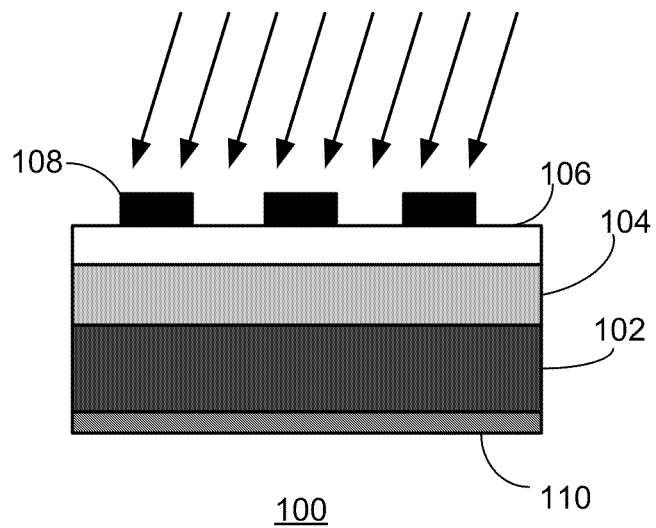
FIG. 1 presents a diagram illustrating the structure of an exemplary crystalline-Si thin-film solar cell.
Figure 2:
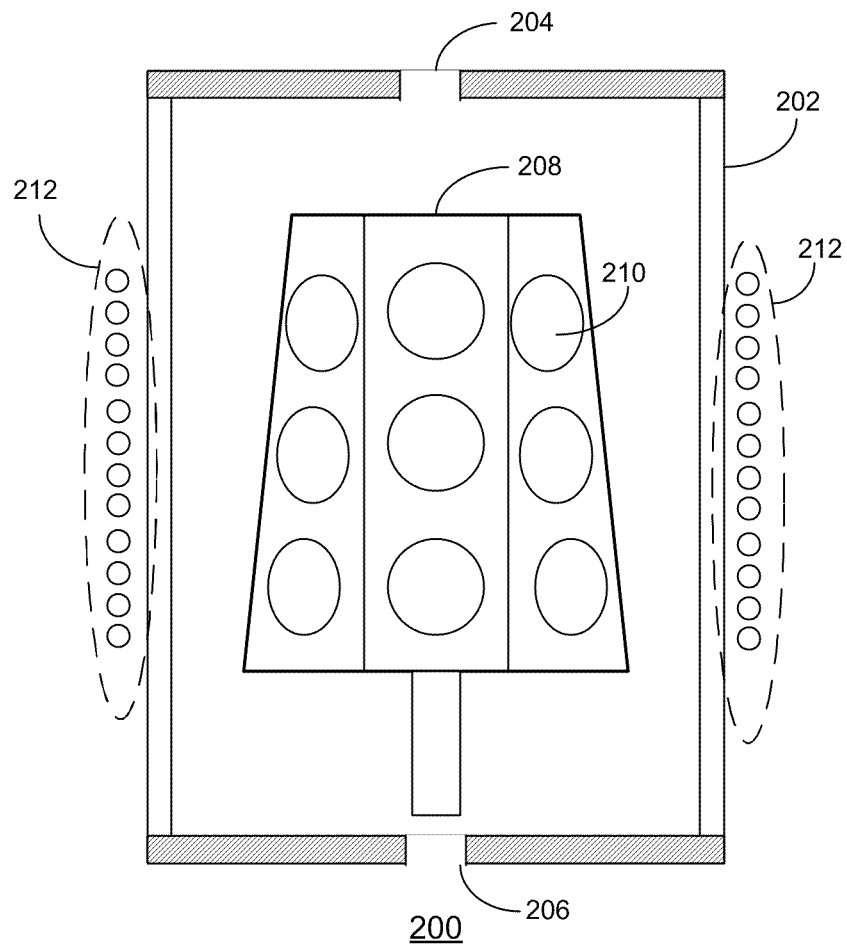
FIG. 2 presents a diagram illustrating a barrel reactor (prior art).
Figure 3:
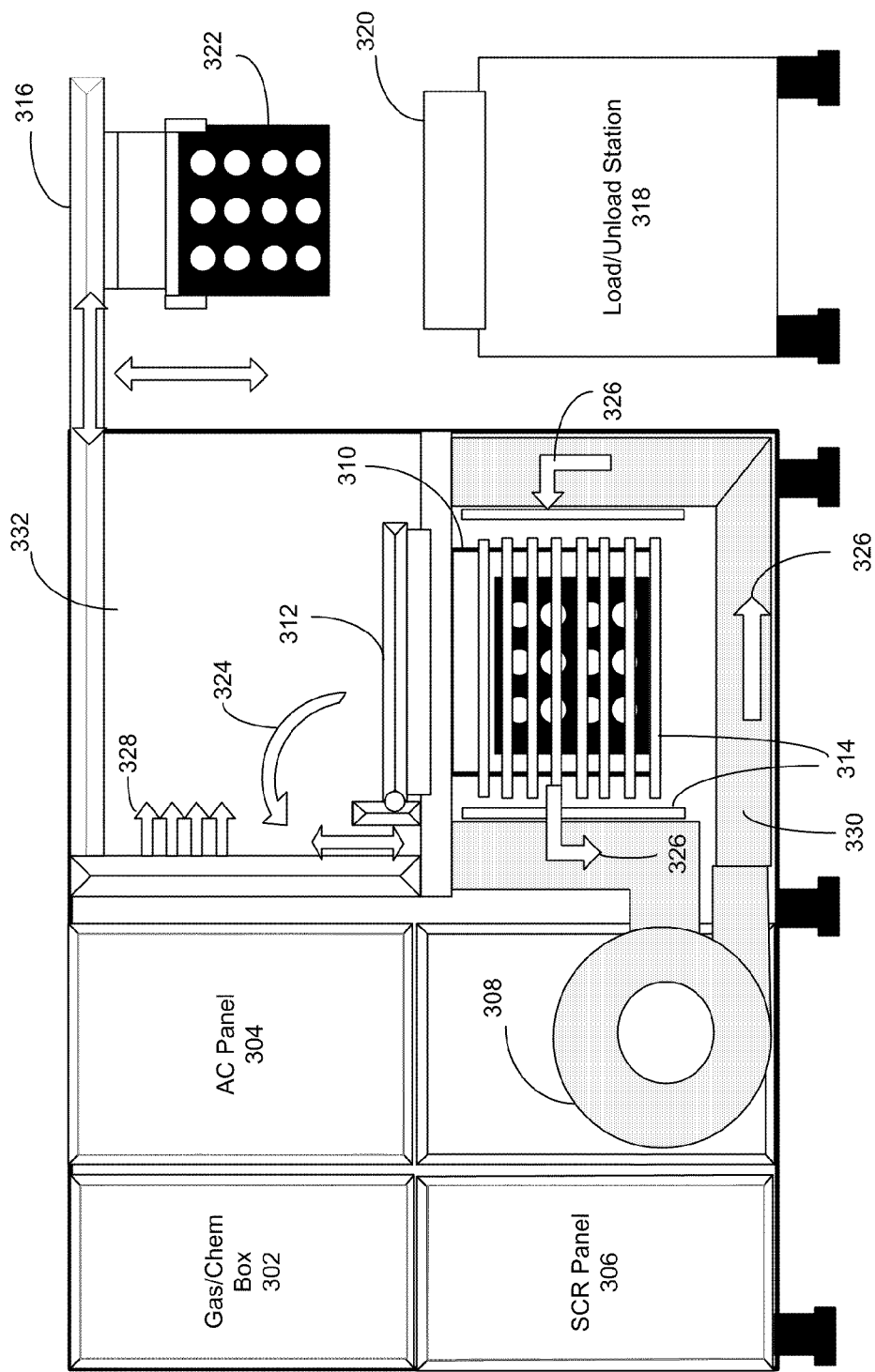
FIG. 3 presents a block diagram illustrating the side view of a 9-chamber epitaxial reactor in accordance with an embodiment of the present invention.

FIG. 3 presents a block diagram illustrating the side view of a 9-chamber epitaxial reactor in accordance with an embodiment. The back portion (left side of FIG. 3) of the reactor includes gas/chemical sources, such as a gas/chemical box 302, and various control panels, such as an AC (alternating current) panel 304 and an SCR (silicon-controlled rectifier) panel 306. A three-zone heat exchanger and blower 308 resides beneath AC panel 304. The front portion of the reactor includes a number of reaction chambers 310. Each reaction chamber is surrounded by lamp heating units 314 and covered with a lid 312. A running beam 316 is attached to the front of the reactor and interfaces with a factory load/unload susceptor station 318. A susceptor stand 320 is situated above load/unload station 318.

AC panel 304 controls the power supply for the entire reactor; gas/chemical box 302 includes the sources of input gases, such as TCS and $H_2$ carrier gas; and SCR panel 306 controls the operation of lamp heating units that surround the chambers. Details of gas/chemical box 302 and SCR panel 306 are shown in FIG. 4, which presents a diagram illustrating the back view of the 9-chamber epitaxial reactor in accordance with an embodiment.

Figure 4:
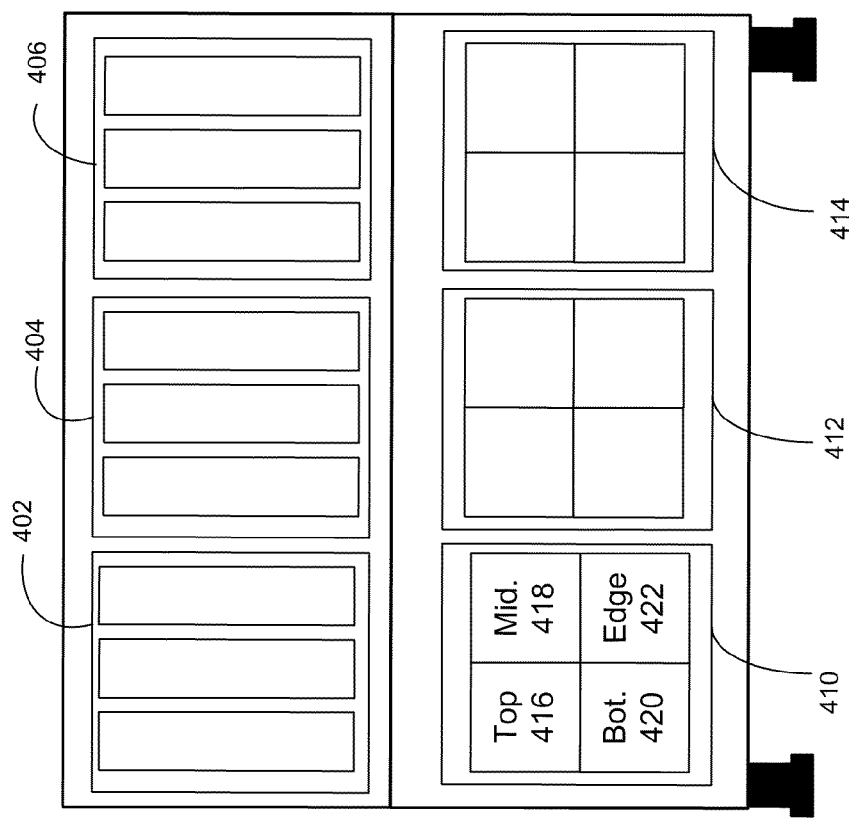
FIG. 4 presents a diagram illustrating the back view of a 9-chamber epitaxial reactor in accordance with an embodiment of the present invention.

The top portion of FIG. 4 illustrates three gas panels 402, 404, and 406. Each gas panel controls the gas inputs for three individual reaction chambers. For example, gas panel 402 includes gas controls for three individual chambers 430, 432, and 434. The bottom portion of FIG. 4 illustrates three SCR panels 410, 412, and 414. Each SCR panel controls the lamp heating units surrounding three corresponding chambers. For example, SCR panel 410 controls lamp heating units surrounding chambers 430, 432, and 434. In addition, each SCR panel has four controls including controls 416-422, and each control independently controls a group of lamps. All lamp heating units surrounding the three reaction chambers are divided into four groups depending on their locations. For example, all lamps residing at the top of the chambers are grouped together to be controlled by top control 416. Similarly, middle control 418, bottom control 420, and edge control 422 control lamps that reside in between the chambers, at the bottom of the chambers, and at the edge of the chambers, respectively. Allowing individual control of lamps located at different locations of a chamber ensures that a uniform temperature can be maintained over a large flat zone inside the reaction chamber and the susceptors can be heated uniformly. In one embodiment, the SCR controls also include a closed-loop feedback mechanism which can further improve the heating uniformity inside the chamber.

FIG. 4 demonstrates that the nine reaction chambers are divided into three groups, each including three chambers. Each group has its own gas panel and heating control. For example, chamber 430, 432, and 434 forms one group, which has its own gas panel 402 and SCR panel 410 for heating controls. The three reaction chambers together with their corresponding gas panel and SCR panel form a multi-chamber module. Because each multi-chamber module can operate independently of other modules, the whole system can provide a flexible throughput. For example, under certain circumstances, only one or two modules of the reaction are operating. In addition, the modular configuration also provides processing scalability. For example, to increase the batch process capability, one can simply add more modules, each including reaction chambers, gas sources, and SCR control, to the existing system without the need to modify the size of the reaction chamber or the configuration of the susceptors. Note that, other than grouping three reaction chambers into one module, other configurations are also possible.

Returning to FIG. 3, three-zone heat exchanger and blower 308 provides a forced airflow in a plenum 330 surrounding reaction chamber 310. Arrows 326 indicate the direction of the forced airflow in plenum 330. Consequently, a pressurized airflow is maintained along the exterior walls of reaction chamber 310 to keep the walls at a uniformly cooler temperature relative to the temperature inside the chamber. In one embodiment, the temperature of the outer surface of chamber 310 is kept at approximately 600° C., thus minimizing Si deposition on the chamber walls.

Before Si deposition, running beam 316 picks up susceptor 322 from factory load/unload susceptor station 318, which is configurable for automatic guided vehicle (AGV), overhead hoist transport (OHT), or a conveyer transport system. Running beam 316 then carries susceptor 322 into a load lock 332. A laminar airflow, as shown by arrows 328, is maintained in load lock 332 during loading to repel dust and other impurities. Chamber 310's lid 312 opens in a direction as shown by arrow 324, and susceptor 322 can be dropped inside chamber 310 for Si deposition. Depending on the configuration of running beam 316, one or more susceptors can be loaded inside the chamber each time.

Figure 5A:
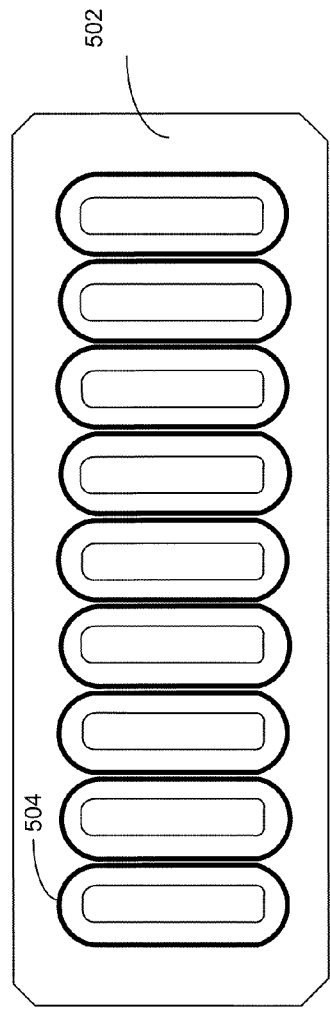
FIG. 5A presents a diagram illustrating the top view of the base plate and chambers of the 9-chamber epitaxial reactor in accordance with an embodiment of the present invention.

FIG. 5A presents a diagram illustrating the top view of the base plate and chambers of the 9-chamber epitaxial reactor in accordance with an embodiment. Base plate 502 can be made of stainless steel or other durable materials. The shape of the cross section of reaction chamber 504 can be, but is not limited to: oblong, rectangular, circular, square, or other shapes.

Figure 5B:
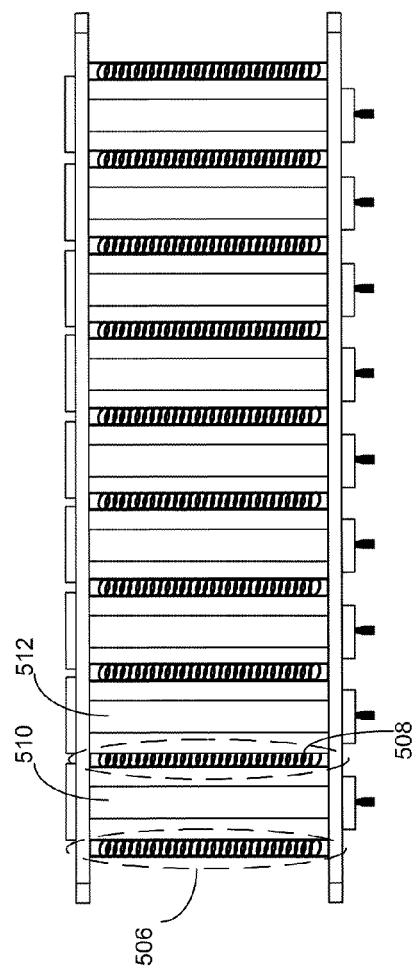
FIG. 5B presents a diagram illustrating the front view of the chambers in the 9-chamber epitaxial reactor in accordance with an embodiment of the present invention.

FIG. 5B presents a diagram illustrating the front view of the chambers in the 9-chamber epitaxial reactor in accordance with an embodiment. Lamp heating units, such as lamp heating units 506 and 508, are alternately inserted between reaction chambers. Consequently, one set of lamp heating units can radiate heat to chambers on both sides, thus greatly increasing energy utilization. For example, lamp heating unit 508, which resides between chambers 510 and 512, radiates heat to both chambers. The size of each lamp or the number of lamps in each lamp heating unit can be varied depending on the size of the chamber and the power of the lamp. In one embodiment, each chamber is surrounded by 22 lamps. The heating units can be made of RF heating coils or tungsten lamps. To further increase energy efficiency, in one embodiment, gold-coated reflectors are mounted around the chambers to reflect back most of the radiant energy from the lamps. In comparison to traditional epitaxial reactors, the radiant heat from lamp heating units in present reactor design is efficiently utilized; thus, the electricity consumption of the 9-chamber epitaxial reactor is significantly reduced, resulting in the reduction of the cost of the epitaxy process.

Chamber and Susceptors

Figure 6A:
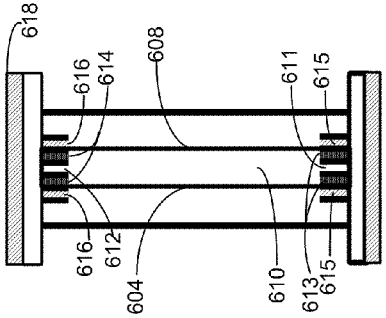
FIG. 6A presents a diagram illustrating the front side of a susceptor inside a reaction chamber in accordance with an embodiment of the present invention.

FIG. 6A presents a diagram illustrating the front side of a susceptor inside a reaction chamber in accordance with an embodiment. A susceptor 604 is placed vertically inside a chamber 602. To avoid heat absorption by chamber walls, chamber 602 is formed using a material that is transparent to radiant heat. In one embodiment, chamber 602 is formed using quartz. By contrast, susceptor 604 can be formed using a material that is opaque and absorbs radiant heat energy, such SiC-coated graphite and monolithic SiC. In one embodiment, susceptor 604 is formed using SiC-coated graphite. As a result, most of the radiant heat from the lamp heating units is absorbed by susceptor 604. In addition, the walls of chamber 602 are kept cool by surrounding forced airflows to reduce Si deposition on the inner surface.

The front side of susceptor 604 includes a set of pockets, such as pocket 606, for supporting substrates to be deposited. The shape of the bottom of the pockets is carefully designed to ensure a good thermal contact between the susceptor and the substrates. In one embodiment, the bottom of pocket 606 has a contour shape. Depending on the size of susceptor 604, various numbers of substrates can fit onto susceptor 604. In one embodiment, susceptor 604 includes 12 pockets for supporting 12 125×125 $mm^2$ substrates.

Figure 6B:
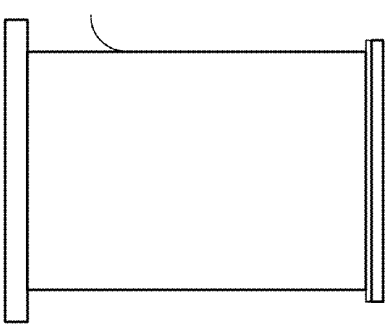
FIG. 6B presents a diagram illustrating the side view of a reaction chamber in accordance with an embodiment of the present invention.
Figure 6C:
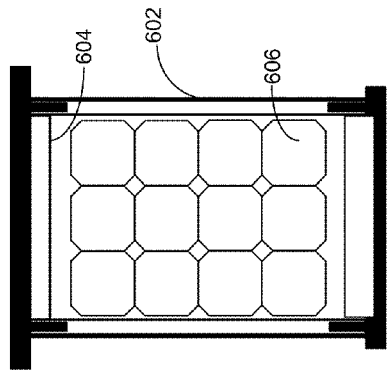
FIG. 6C presents a diagram illustrating the front view of the cross section of a reaction chamber in accordance with an embodiment of the present invention.

FIG. 6B presents a diagram illustrating the side view of a reaction chamber in accordance with an embodiment. FIG. 6B illustrates an outer wall of quartz chamber 602. FIG. 6C presents a diagram illustrating the front view of the cross section of a reaction chamber in accordance with an embodiment. FIG. 6C demonstrates that a pair of susceptors, susceptor 604 and susceptor 608, are placed vertically inside reaction chamber 602. A narrow channel 610 is formed between susceptors 604 and 608. Also shown in FIG. 6C are a number of gas inlets and outlets 611-616 for injecting precursor and/ or purge gases and for outputting exhaust, and a nozzle flange 618. Note that as explained in further details later, gas inlets 611 and 612 are configured to injecting precursor gases, gas outlets 613 and 614 are configured to outputting exhaust, and gas inlets 615 and 616 are configured to injecting they purge gas. Nozzle flange 618 interfaces between the gas inlets, outlets, and the corresponding gas pipelines.

Figure 6D:
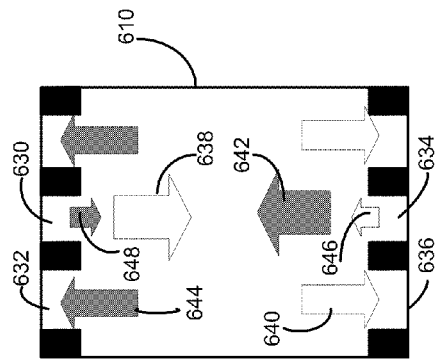
FIG. 6D presents a diagram illustrating the top view of the cross section of a reaction chamber in accordance with an embodiment.

FIG. 6D presents a diagram illustrating the top view of the cross section of a reaction chamber in accordance with an embodiment. FIG. 6D illustrates that the cross sections of susceptors 604 and 608 are shaped like an "U." The vertical edges of susceptors 604 and 608 are in contact with each other forming an enclosed narrow channel 610. As a result, during deposition, the precursor gases, such as TCS, can be contained within narrow channel 610. Other examples of precursor gases include, but are not limited to: $SiH_4$, $SiH_2Cl_2$, and $SiCl_4$. In addition to "U" shape, the cross sections of susceptors 604 and 608 can form other shapes, include but are not limited to: half circle, half eclipse, and other regular or irregular shapes. Note that the front sides (i.e., the wafer-holding sides) of susceptors 604 and 608 are facing each other. Thus, the deposition substrates, such as substrate 606, have their deposition surfaces surround channel 610, which contains the precursor gases and keeps them from depositing material on the inner walls of chamber 602. Such a configuration can increase the TCS gas utilization rate significantly because the probability for the TCS gas to successfully deposit Si on substrates surfaces is now much higher. The increased deposition probability results from the precursor gases being surrounded by deposition surfaces as well as the reduced deposition on the inner walls of chamber 602. Note that channel 610 cannot be too narrow to ensure sufficient gas flow in the channel. The width of channel 610 (the distance between susceptors 604 and 608) can be between 5 mm and 200 mm. In one embodiment, the width of channel 610 is between 20 mm and 30 mm and a TCS utilization rate of up to 30% can be achieved.

In addition to enabling better gas utilization, this configuration has the back sides of the susceptors facing the chamber wall and the lamp heating unit, which ensures efficient radiant-heat-energy absorption from the lamp heating units by the black susceptors. The susceptors then transfer the absorbed heat energy to the substrates. In an alternative embodiment, a single susceptor is placed vertically inside the reaction chamber. Deposition substrates are mounted on both sides of the susceptor and face lamp heating unit directly.

Figure 6E:
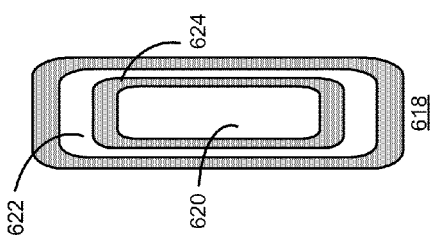
FIG. 6E presents a diagram illustrating the top view of gas nozzle 614 in accordance with an embodiment of the present invention

In a solar cell, film uniformity greatly impacts the solar cell's efficiency. In a traditional epitaxial system, it has been difficult to achieve good deposition uniformity and a high reaction-gas-utilization rate at the same time. Substrate rotation can be used to improve uniformity. However, it becomes increasingly difficult to rotate substrates in a large batch reactor. To achieve better deposition uniformity, in one embodiment, precursor gases, such as TCS and $H_2$, are injected into channel 610 inside chamber 602 via gas inlets 611 and 612, which are located at the top and bottom of chamber 602, respectively. During deposition, the chamber pressure can be kept between 1 Torr and 1520 Torr. FIG. 6E presents a diagram illustrating the top view of a gas nozzle flange in accordance with an embodiment of the present invention. Gas nozzle 618 includes an opening 620 and an opening 622, which are segregated from each other by a gas ring 624. Opening 620 corresponds to gas inlets 611 and 612, and can be used for injecting precursor gases to channel 610. Opening 622 corresponds to gas outlets 613 and 614, and can be used for outputting exhaust. Because opening 620 and opening 622 are segregated by gas ring 624 and are coupled to different gas lines, there is no contamination from the exhaust. Gas inlets 611 and 612 couple to gas sources through a switching manifold valve and are configured to turn on alternately. In addition, the opening and closing of gas outlets 613 and 614 also alternate to synchronize with the close and open steps of gas inlets. As a result, the gas flow direction inside chamber 602, or, more specifically, inside channel 610, is alternated in sequence.

Figure 6F:
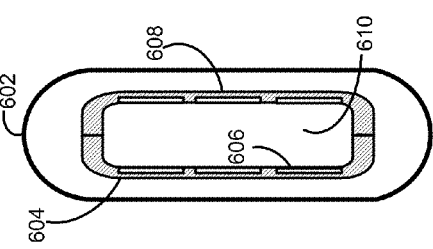
FIG. 6F presents a diagram illustrating the gas flow sequence of gas inlets and outlets in accordance with an embodiment of the present invention.

FIG. 6F presents a diagram illustrating the gas flow sequence of gas inlets and outlets in accordance with an embodiment of the present invention. During step 1, gas inlet 630 of the top gas nozzle is open to inject precursor gases including TCS and $H_2$ into channel 610. Arrow 638 indicates the flow direction of the precursor gases. Also in step 1, gas outlet 636 of the bottom gas nozzle is open to output exhaust gas. Arrow 640 indicates the flow direction of the exhaust gas. Gas outlet 632 of the top gas nozzle and gas inlet 634 of the bottom gas nozzle are closed during step 1.

Similarly, during step 2, gas inlet 634 of the bottom gas nozzle is open to inject precursor gases including TCS and $H_2$ into channel 610. Arrow 642 indicates the flow direction of the precursor gases. Also in step 2, gas outlet 632 of the top gas nozzle is open to output exhaust gas from channel 610. Arrow 644 indicates the flow direction of the exhaust gas. Gas inlet 630 of the top gas nozzle and gas outlet 636 of the bottom gas nozzle are closed during step 2. Because the current configuration allows the flow direction of the precursor gases inside channel 610 to alternate sequentially, a uniform deposition characteristic on substrates can be achieved without the need to rotate the susceptors. Note that besides placing gas nozzles at the top and bottom of the chamber, other configurations, such as different numbers of nozzles or different nozzle positions, are also possible for improving uniformity.

In order to prevent Si deposition around gas inlets 630 and 634 while they were closed for injection, which can be a source of contamination, in one embodiment, instead of being closed during their "off" step, gas inlets 630 and 634 are kept on for injecting a small amount of reverse purge gas. Ideally, the amount of reverse purge gas flow is sufficiently small to prevent interference with the flow direction in channel 610. In one embodiment, the flow rate of the reverse purge gas is less than 5% of the flow rate of the precursor. For example, in step 1, a small amount of reverse purge gas is injected from gas inlet 634 as indicated by arrow 646. Similarly, in step 2, a small amount of reverse purge gas is injected from gas inlet 630 as indicated by arrow 648. The existence of small amount of purge gas that flows in the reverse direction of the precursor gases creates turbulence around the gas inlets, thus preventing the precursor gases from depositing Si around the gas inlets. Some embodiments use $H_2$ as the reverse purge gas. Some embodiments use HCl or $SiCl_4$ as the reverse purge gas. In addition to creating turbulence around the gas inlets, HCl or $SiCl_4$ can react with Si, thus capable of removing any possible Si deposition around the gas inlet. Note that because the reaction product between HCl (or $SiCl_4$) and Si is TCS, no contamination is added to the chamber. In a further embodiment, HCl or $SiCl_4$ is mixed with $H_2$ to be used as a reverse purge gas.

Returning to FIG. 6C, in addition to gas inlets 611 and 612, chamber 602 is also coupled to gas inlets 615 and 616 for injecting a backside-purge gas between the back sides of susceptors 604 and 608 and the inner walls of chamber 602. The gas pressure between the back sides of susceptors 604 and 608 and the inner walls of chamber 602 is kept equal or more than the gas pressure inside channel 610, thus preventing TCS gas contained in channel 610 to leak into the space next to the inner chamber wall. The existence of a backside-purge gas flow between the back sides of susceptors and the chamber walls further reduces the risk of depositing Si onto the inner walls of chamber 602. Similar to the reverse purge gas, the backside-purge gas can be $H_2$, HCl, $SiCl_4$, and a combination thereof Similarly, as long as the backside-purge gas can be injected, the positions of gas inlets 615 and 616acan be different than the ones shown in FIG. 6C, or the number of backside-purge gas inject nozzles can be fewer or more than two.

Figure 7:
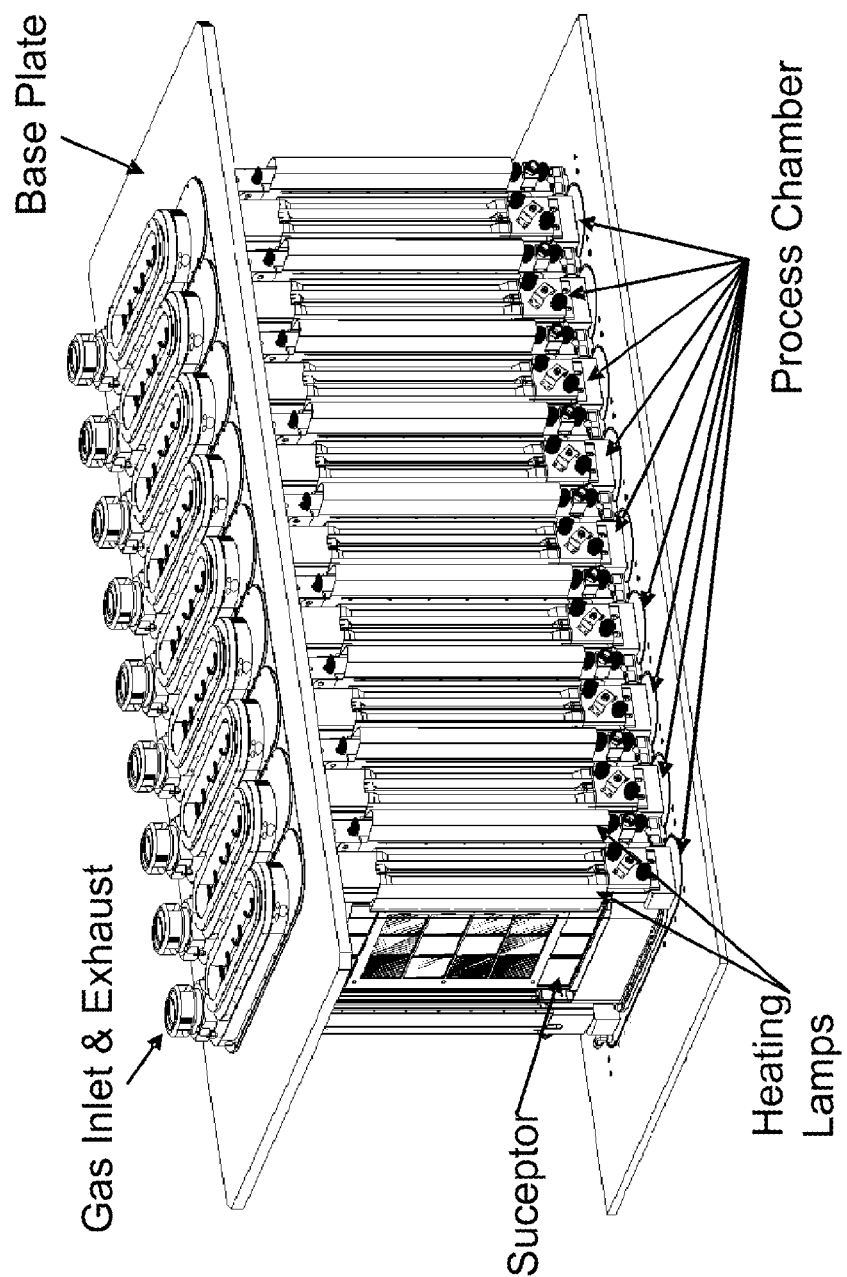
FIG. 7 illustrates an exemplary multi-chamber reaction module in accordance with one embodiment of the present invention.

FIG. 7 illustrates an exemplary multi-chamber reaction module in accordance with one embodiment of the present invention. As illustrated in FIG. 7, a heating lamp is "sandwiched" between two process chambers. Therefore, the radiant energy from the heating lamp can be fully utilized for the deposition.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. An apparatus for material deposition, comprising:
   a reaction chamber formed using a material that is transparent to radiation energy;
   a pair of susceptors situated inside the reaction chamber, wherein each susceptor has a front side and a back side, wherein the front side mounts a number of substrates, wherein the susceptors are positioned vertically in such a way that the front sides of the susceptors face each other, and wherein the vertical edges of the susceptors are in contact with each other, thereby forming a substantially enclosed narrow channel between the substrates mounted on different susceptors; and
   a first gas nozzle situated at a top of the reaction chamber and a second gas nozzle situated at a bottom of the reaction chamber directly below the first gas nozzle, wherein each of the first and second gas nozzles includes a gas inlet for injecting reaction gas into the narrow channel and a gas outlet for outputting exhaust, wherein the gas outlet associated with either the first or the second gas nozzle encloses the gas inlet associated with a same gas nozzle, wherein the gas inlet and the gas outlet associated with either the first or the second gas nozzle are coupled to different gas lines, and wherein the gas inlet and the gas outlet associated with either the first or the second gas nozzle are controlled in such a way that reaction gas flow directions inside the narrow channel can be alternated, thereby facilitating uniform material deposition.

2. The apparatus of claim 1, wherein the flow rate of the purge gas is less than 5% of the flow rate of the reaction gas.

3. The apparatus of claim 1, wherein the gas inlet associated with either the first or the second gas nozzle is configured to inject a predetermined small amount of purge gas when the gas inlet associated with either the first or the second gas nozzle is not injecting reaction gas to the narrow channel during material deposition, thereby preventing material deposition around the gas inlet associated with either the first or the second gas nozzle, and wherein the purge gas comprises at least one of the following: HCl, $SiCl_4$, and $H_2$.

4. The apparatus of claim 1, further comprising a number of heating units situated outside the reaction chamber, wherein the heating units are arranged in such a way that they radiate heat energy directly to the back sides of the susceptors.

5. A system for material deposition, comprising:
   a multi-chamber module, comprising:
      a number of reaction chambers situated next to each other, wherein the chambers are formed using a material that is transparent to radiation energy, and wherein at least one reaction chamber comprises:
         a pair of susceptors situated inside the reaction chamber, wherein each susceptor has a front side and a back side, wherein the front side mounts a number of substrates, wherein the susceptors are positioned vertically in a such way that the front sides of the susceptors face each other, and wherein the vertical edges of the susceptors are in contact with each other, thereby forming a substantially enclosed narrow channel between the substrates mounted on different susceptors; and
         a first gas nozzle situated at a top of the reaction chamber and a second gas nozzle situated at a bottom of the reaction chamber directly below the first gas nozzle, wherein each of the first and second gas nozzles includes a gas inlet for injecting reaction gas into the narrow channel and a gas outlet for outputting exhaust, wherein the gas outlet associated with either the first or the second gas nozzle encloses the gas inlet associated with a same gas nozzle, wherein the gas inlet and the gas outlet associated with either the first or the second gas nozzle are coupled to different gas lines, wherein the gas inlet and the gas outlet associated with either the first or the second gas nozzle are controlled in such a way that reaction gas flow directions inside the narrow channel can be alternated, thereby facilitating uniform material deposition; and
      a number of heating units situated outside each reaction chamber, wherein at least one heating unit is situated between the side walls of two adjacent reaction chambers, thereby allowing the at least one heating unit to radiate heat energy to the two adjacent reaction chambers simultaneously, and wherein the heating units are arranged in such a way that they radiate heat energy directly to the back sides of the susceptors.

6. The system of claim 5, wherein the flow rate of the purge gas is less than 5% of the flow rate of the reaction gas.

7. The system of claim 5, wherein the gas inlet associated with either the first or the second gas nozzle is configured to inject a predetermined small amount of purge gas when the gas inlet is not injecting reaction gas to the narrow channel during material deposition, thereby preventing material deposition around the gas inlet associated with either the first or the second gas nozzle, and wherein the purge gas comprises at least one of the following: HCl, $SiCl_4$, and $H_2$.

* * * * *